US007579283B2

(12) United States Patent
Choi et al.

(10) Patent No.: US 7,579,283 B2
(45) Date of Patent: Aug. 25, 2009

(54) INSULATING LAYER PATTERNING METHOD, INSULATING LAYER FORMED BY THE INSULATING LAYER PATTERNING METHOD, DISPLAY DEVICE HAVING THE INSULATING LAYER

(75) Inventors: Sang-Jun Choi, Yongin-si (KR); Jung-hyun Lee, Yongin-si (KR); Sang-bong Bang, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 401 days.

(21) Appl. No.: 11/653,390

(22) Filed: Jan. 16, 2007

(65) Prior Publication Data

US 2007/0184667 A1 Aug. 9, 2007

(30) Foreign Application Priority Data

Jan. 13, 2006 (KR) .................... 10-2006-0003936

(51) Int. Cl.
*H01L 21/302* (2006.01)
(52) U.S. Cl. ..................................... 438/714; 438/708
(58) Field of Classification Search ................ 430/313, 430/314, 330, 326, 328, 329; 216/16, 49, 216/66, 62, 87; 438/690, 708, 714, 725
See application file for complete search history.

(56) References Cited

U.S. PATENT DOCUMENTS 6,403,407 B1 * 6/2002 Andry et al. ................. 438/158
7,177,072 B2 * 2/2007 Nihei et al. .................. 359/326

* cited by examiner

*Primary Examiner*—David Vu
(74) *Attorney, Agent, or Firm*—Sughrue Mion, PLLC

(57) ABSTRACT

Provided is an insulation layer patterning method employing a flowable oxide, which does not use a photo-resist. Also, an insulation layer pattern and display devices including the insulation layer are disclosed.

21 Claims, 7 Drawing Sheets

INSULATING LAYER PATTERNING METHOD, INSULATING LAYER FORMED BY THE INSULATING LAYER PATTERNING METHOD, DISPLAY DEVICE HAVING THE INSULATING LAYER

CROSS-REFERENCE TO RELATED PATENT APPLICATION

This application claims the benefit of Korean Patent Application No. 10-2006-0003936, filed on Jan. 13, 2006, in the Korean Intellectual Property Office, the disclosure of which is incorporated herein in its entirety by reference.

BACKGROUND OF THE INVENTION

1. Field of the Invention

The present invention relates to a method for producing an insulation layer pattern, an insulating layer formed by the method, and a display device having the insulating layer. The method produces a nano-sized pattern in a simple and cost-effective way.

2. Description of the Related Art

With the development of the semiconductor industry, the integration and precision of a semiconductor device is getting more important. A technology for realizing a precise fine pattern has been studied. A photo-resist pattern is generally used as an etching mask in a pattern forming process. Since a photo-resist layer can be easily patterned in a desired size and shape through a light exposure and developing processes, it has been widely used in a semiconductor manufacturing process.

FIG. 1 shows a conventional method for forming an insulation layer pattern.

Referring to FIG. 1, a $SiO_2$ is deposited on a substrate and a photo-resist is applied and dried. A predetermined region of the resulting substrate structure is exposed to light and developed through a lithography process. Then, a desired pattern is completed through etching and stripping processes.

Although the conventional method attained a fine pattern, the process is complicated and time-consuming. In recent years, as the design rule has been reduced, there has been a limitation in using the photo-resist pattern as an etching mask. Particularly, as the designed rule is reduced to be less than 10 nm, problems have been arisen in a semiconductor manufacturing process. For example, when the photo-resist pattern is used as an etching mask, residual etching material may form a striation on a resulting patterned layer after the etching process is finished. In order to remove the striation and other impurities, a cleaning process is performed. However, during the cleaning process, an inter-insulation layer may be damaged.

In addition, a process margin of the etching process is small and the resulting layer pattern may not have a desired shape.

Furthermore, in the stripping process after the etching process is performed, $H_2SO_4$ and $H_2O_2$, which are used to remove photo-resist, may cause damage to a metallic substrate. Likewise, in an $O_2$ ashing process for removing the photo-resist, the metal substrate may be damaged.

Therefore there has been a need for a simplified and reliable method for forming an insulation layer pattern which can produce a fine and precise pattern without causing damage to the substrate or an insulation layer due to chemicals used in, etching, stripping or ashing processes.

SUMMARY OF THE INVENTION

The present invention provides a simplified method for producing an insulation layer pattern of high precision, without causing damage to a substrate or insulation layer in a cost effective way.

The present invention also provides an insulation layer formed by such a method and a display device comprising the insulation layer.

According to one aspect of the present invention, there is provided a method for producing an insulation layer pattern comprising forming a flowable oxide insulation layer on a surface of a substrate, said flowable oxide insulation layer is formed of a flowable oxide and a carrier solvent;

exposing a region of the flowable oxide insulation layer to an energy source thereby removing the carrier solvent from the exposed region of the flowable oxide insulation layer while an unexposed region of the flowable oxide insulation layer retains the carrier solvent; and contacting the unexposed region of the flowable oxide insulation layer with a developer which is capable of dissolving the carrier solvent and the flowable oxide, thereby removing the carrier solvent and the flowable oxide from the exposed region to form an insulation layer pattern on the substrate.

In another aspect of the present invention, there is provided an insulation layer formed through the above-described insulation layer patterning method.

In another aspect of the present invention, there is provided a display device having the insulation layer.

According to the present invention, a boundary surface of the insulation layer pattern has a good profile and the substrate is not damaged during the etching process. In addition, a precise pattern can be realized. Since lithography, etching and stripping processes that have been used in the prior art are simplified, the processing costs and time can be reduced.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
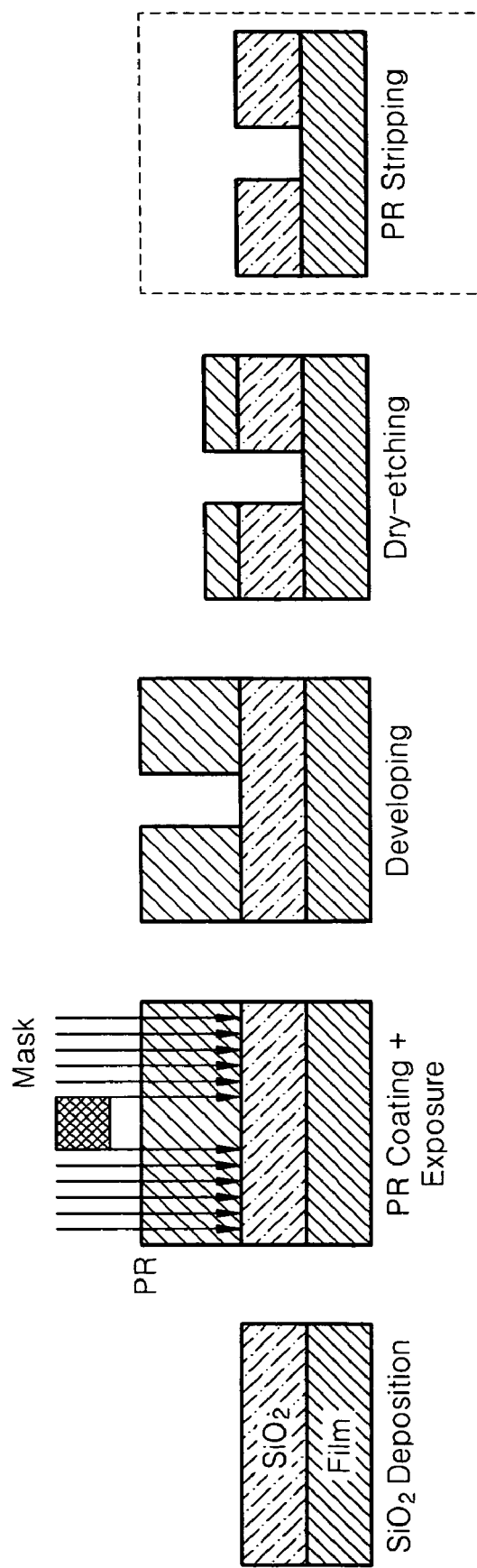
FIG. 1 is a view illustrating a conventional photolithographical patterning method.

The present invention will now be described in more detail.

Recently, a flowable oxide such as hydrogen silsesquioxane ("HSQ")-based flowable oxide has been studied for its suitability for use in nanolithography applications. In its cured state, HSQ undergoes cross-linking resulting in HSQ having an amorphous structure similar to $SiO_2$. HSQ has low-k dielectric and excellent gap filling characteristics. It has been used to form a coating on a substrate. For example, U.S. Pat. No. 5,085,893 discloses a method for forming a protective coating of a silsesquioxane resin on a substrate by coating the substrate with a solution comprising a non-sulfur containing polar organic solvent containing a composition of the formula $(RSi(OH)_xO_{3-x/w})_n$ where R is a hydrogen or a methyl group, n is an integer greater than about 8, and x is a number of 0-2, evaporating the solvent and thereby depositing an insoluble silsesquioxane coating on the substrate, and curing the silsesquioxane coating to a silicon dioxide-containing ceramic by subjecting the coating to an oxidizing atmosphere at a temperature of about 100-1000° C. U.S. Pat. No. 5,981,354 discloses a planarization using HSQ.

Word et al. reported patterning HSQ employing electron beam lithography. Word et al., Nanometer-period Grating in Hydrogen Silsesquioxane Fabricated by Electron Beam Lithography, J. Vac. Sci. Technol. B 21(6), November/December 2003, pp L12-L15.

However, none of these references teach a method for forming an insulation layer pattern using a flowable oxide in a carrier solvent and a developer, which can dissolve the flowable oxide and the carrier solvent, as discussed hereinafter.

The present invention is directed to a method for producing a patterned insulation layer comprising a flowable oxide. Such a layer may be suitable for use in display devices, which may include, but are not limited to, vacuum fluorescent display (VFD), a cathode ray tube (CRT), a field emission display (FED), and a plasma display panel (PDP).

The insulation layer patterning method has the following advantages as compared with the prior art patterning method using a photo-resist.

1. Since lithography, etching and stripping processes that have been used in the conventional patterning processes are simplified, a substrate is protected from strong reagents such as $H_2SO_4$ and $H_2O_2$ even when the substrate is formed of a metallic material. Furthermore, since there is no ashing process using $O_2$, a layer damage that may occur during the prior art etching process can be prevented.

2. According to the present invention, a vacuuming process for the $SiO_2$ deposition and the dry-etching process is omitted, resulting in the reduction of the processing costs and time. Also, the process of the present invention may be used in a display device manufacturing process which does not include a dry etching step.

3. In the conventional patterning process using a photoresist, the preciseness of the pattern depends on both the lithography and etching processes. However, in the present invention, since the preciseness of the pattern depends on only the lithography process, the process reliability can be improved.

According to the insulating layer patterning method of the present invention, an insulation layer pattern is formed on a substrate by applying the substrate with a composition comprising a flowable oxide and a carrier solvent to form an insulation layer, exposing a certain region of the insulation layer to light, and contacting an unexposed region of the insulation layer with a certain developer to form a desired pattern.

The term "flowable oxide," as employed herein, may be defined as a solution where $SiO_{2-x}$ ($0.05 \geqq x \geqq 0.5$) is dissolved. For example, the flowable oxide is a composition comprising an insulation substance such as $SiO_2$, SiON or a mixture thereof and a solvent which is capable of dissolving the insulation substance. Such solvent may include, but be not limited to, $H_2O$ or $H_2O_2$. The flowable oxide of the present invention may be prepared by dissolving a monomer such as $H-Si-OCH_3$ or $H-Si(OR)_3$ ($R=CH_3$ or $C_2H_5$) in an aqueous solvent. The aqueous solvent may be $H_2O$ or deionized water.

The flowable oxide also include silsesquioxanes, particularly, a hydrogen silsesquioxane may be one that is commercially available under the tradename FOx® from Dow Corning. FOx® products may be diluted with, for example, methyl isobutyl ketone (MIBK) or tetra-methyl ammonium hydroxide (TMAH) to obtain a HSQ film of a desired thickness.

According to the present invention, the flowable oxide is combined with a carrier solvent to form an insulation layer pattern. The carrier solvent of the flowable oxide is a material that does not affect the properties of flowable oxide. According to the present invention, the carrier solvent is evaporated upon application of an energy source such as light. The carrier solvent also is soluble in a developer, which will be described in detail hereinafter, as well as in a solvent which is used to dissolve the insulation substance. The carrier solvent may be methyl isobutyl ketone (MIBK), tetra-methyl ammonium hydroxide (TMAH), or a mixture thereof. MIBK has been widely used as a developing solution.

A weight ratio of the flowable oxide to the carrier solvent may be in a range from about 1:1 to about 1:10. When the weight ratio is less than about 1:1, since the flowable oxide may not be fully dissolved, the reactivity with the developer is deteriorated. When the weight ratio is greater than about 1:10, since the viscosity of the mixture solution is lowered, it is difficult to adjust a thickness of the resulting layer.

Application of the flowable oxide solution onto a substrate may be carried out by a method which is well known to one skilled in the art. A spin-on coating may be used. Once the flowable oxide solution is applied to form a coating on a substrate, the coated substrate is baked at a temperature ranging from about 100° C. to about 130° C. to cure the flowable oxide insulation layer.

The substrate may be formed of metal, plastic or glass. The substrate may be formed of silicon.

A thickness of the flowable oxide insulation layer may be in a range from about 50 nm and 200 nm. When the thickness of the flowable oxide insulation layer is less than about 50 nm, the process-reproducibility is lowered. When the thickness of the flowable oxide insulation layer is greater than about 200 nm, the permeability is lowered in a subsequent exposure process.

A predetermined region of the cured flowable oxide insulation layer, which corresponds to a desired pattern, is exposed to an energy source which evaporates the carrier solvent of the flowable oxide insulation layer, but does not affect or damage the flowable oxide. Such an energy source may be light. For example, any light sources from UV, DUV to X-ray may be used. In an exemplary embodiment, the cured flowable oxide insulation layer is exposed to light using a known lithography tool to remove the carrier solvent from the exposed region of the flowable oxide insulation layer.

When light is used to remove the carrier solvent, its intensity may be in a range from about 100 mJ/cm$^2$ to about 2000 mJ/cm$^2$. Meanwhile, the carrier solvent remains in a non-exposed region of the flowable oxide insulation layer. The exposure of a predetermined region of the flowable oxide insulation layer may be carried out using a mask, which has a desired pattern and does not penetrate the energy source. Materials and preparation of such a mask are known in the art.

The unexposed region of the flowable oxide insulation layer is then contacted with a developer to form an insulation pattern. The developer is a chemical which dissolves the carrier solvent and the flowable oxide contained in the carrier solvent, but the flowable oxide is substantially free of the carrier solvent. By contacting the unexposed region of the flowable oxide insulation layer with a developer, the flowable oxide and the carrier solvent of the unexposed region are removed to reveal the surface of the substrate of the unexposed region, while leaving the flowable oxide insulation layer of the exposed region, which is substantially free of the carrier solvent, on the substrate. The developer may include, but is not limited to, an alcohol. Alcohol, which may be used as a developer in the present application, includes, but is not limited to, methanol, ethanol, isopropyl alcohol. In one embodiment, the flowable oxide insulation layer is immersed in isopropyl alcohol for about 5 minutes - about 10 minutes.

Figure 5A:
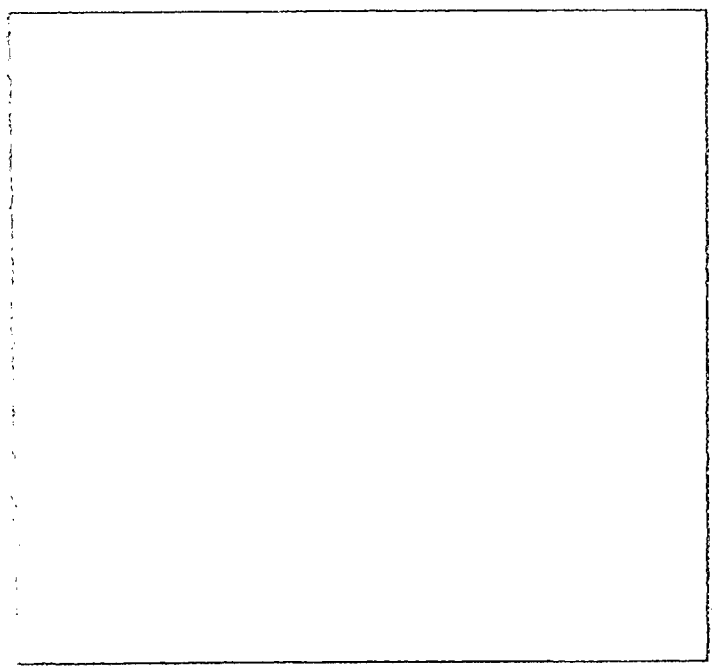
FIG. 5A is a top photograph showing an insulation layer having a stripe pattern, which is formed by the method according to the embodiment of the present invention.
Figure 5B:
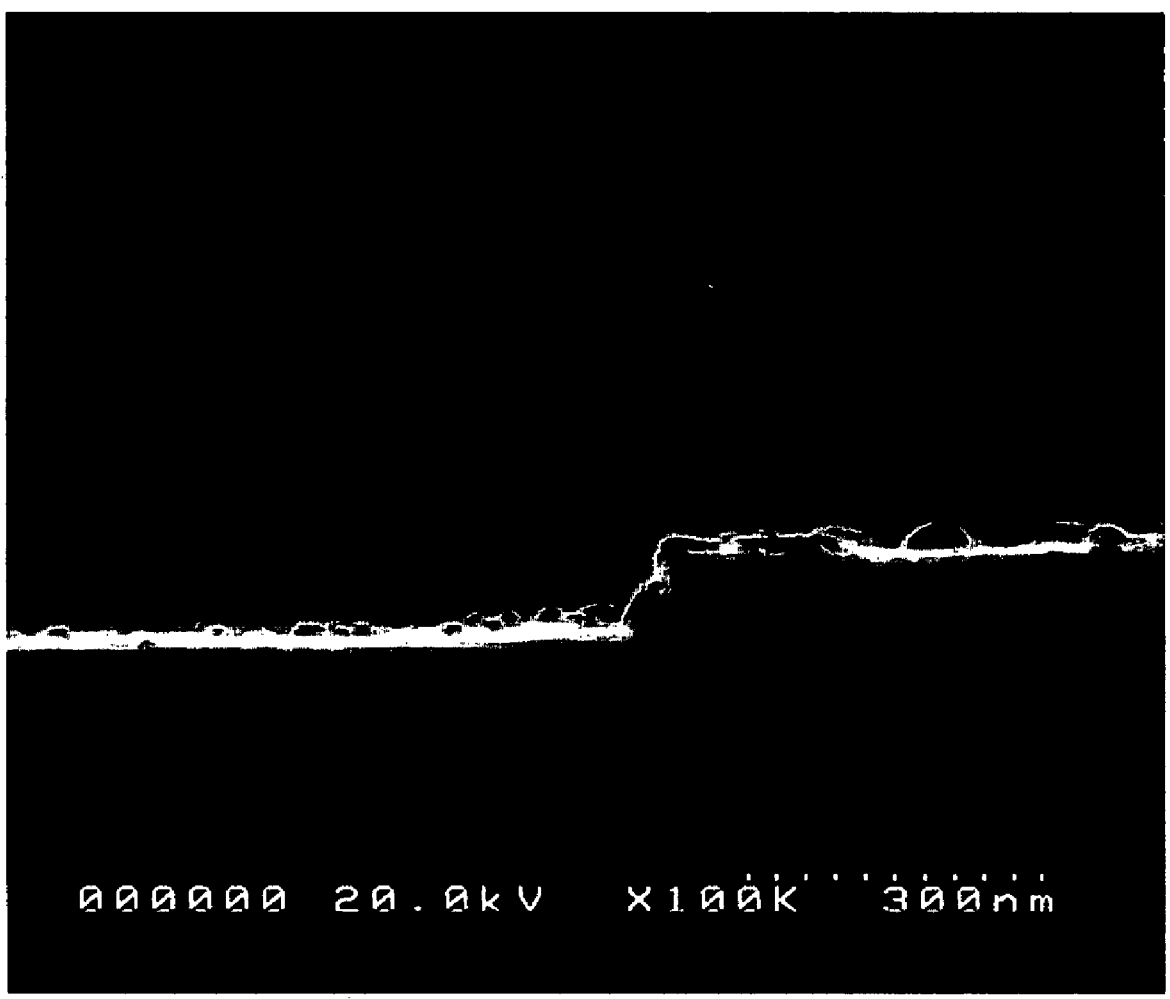
FIG. 5B is a side sectional photograph of the insulation layer depicted in FIG. 5A.

When the flowable oxide insulation layer is dipped in the isopropyl alcohol, the removal of the non-exposed region of the flowable oxide insulation layer is anisotropically realized. Therefore, a problem of prior art due to isotropical development that a boundary profile between the dissolved region and the non-dissolved region (the exposed region) is deteriorated (etched) can be prevented. The isopropyl alcohol does not damage the substrate regardless of a material of the substrate such as metal, an oxide or a nitride that is used to form the substrate. FIG. 5A shows a top photograph of a SiO$_2$ stripe pattern that is anisotropically formed on the silicon substrate. FIG. 5B shows a side sectional photograph of the SiO$_2$ stripe pattern.

The flowable oxide insulation layer pattern formed on the substrate may be further baked at a temperature of about 120° C.- about 200 ° C. When the baking temperature is lower than about 120° C., the property of the insulation layer may be deteriorated. When the baking temperature is higher than about 200° C., the insulation layer may shrink.

Figure 2:
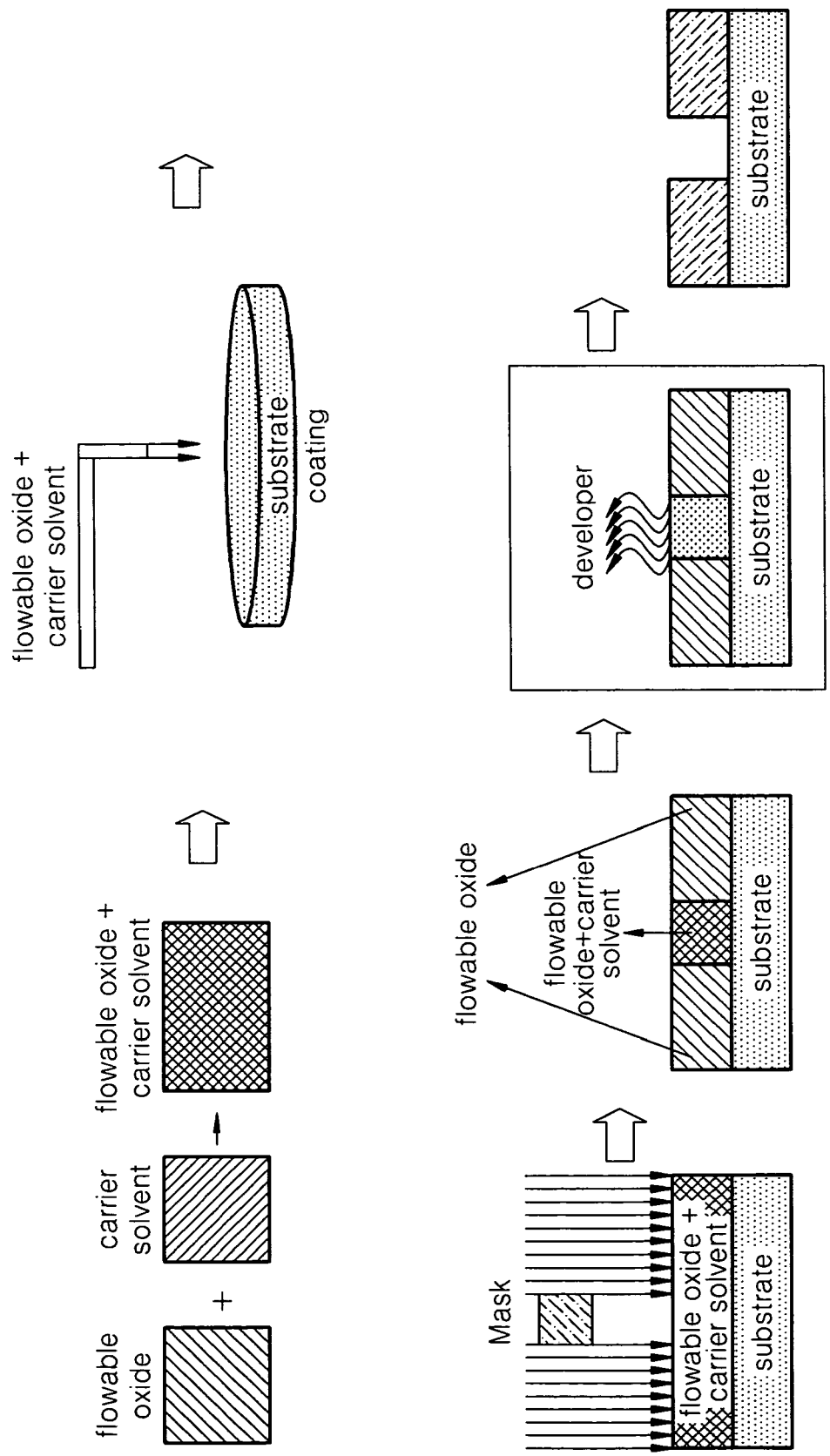
FIG. 2 is a sequential diagram illustrating an insulation layer patterning method according to an embodiment of the present invention.

FIG. 2 is a sequential diagram illustrating an insulation layer patterning method according to an embodiment of the present invention.

Referring to FIG. 2, a flowable oxide solution is provided by combining a flowable oxide (a SiO$_2$ solution) with a carrier solvent. The resulting flowable oxide solution is coated on a substrate. Then, a predetermined region of the coating layer, which corresponds to a desired pattern, is exposed to light using a lithography tool so that the carrier solvent of the exposed region is removed. Then, the flowable oxide insulation layer on a substrate is dipped in the isopropyl alcohol so that the carrier solvent remained in a non-exposed region of the flowable oxide insulation layer is dissolved, and at the same time, the flowable oxide of the non-exposed region is also dissolved together with the carrier solvent. As a result, the desired pattern is formed on the substrate. This pattern is baked to form a SiO$_2$ layer.

Figure 3:
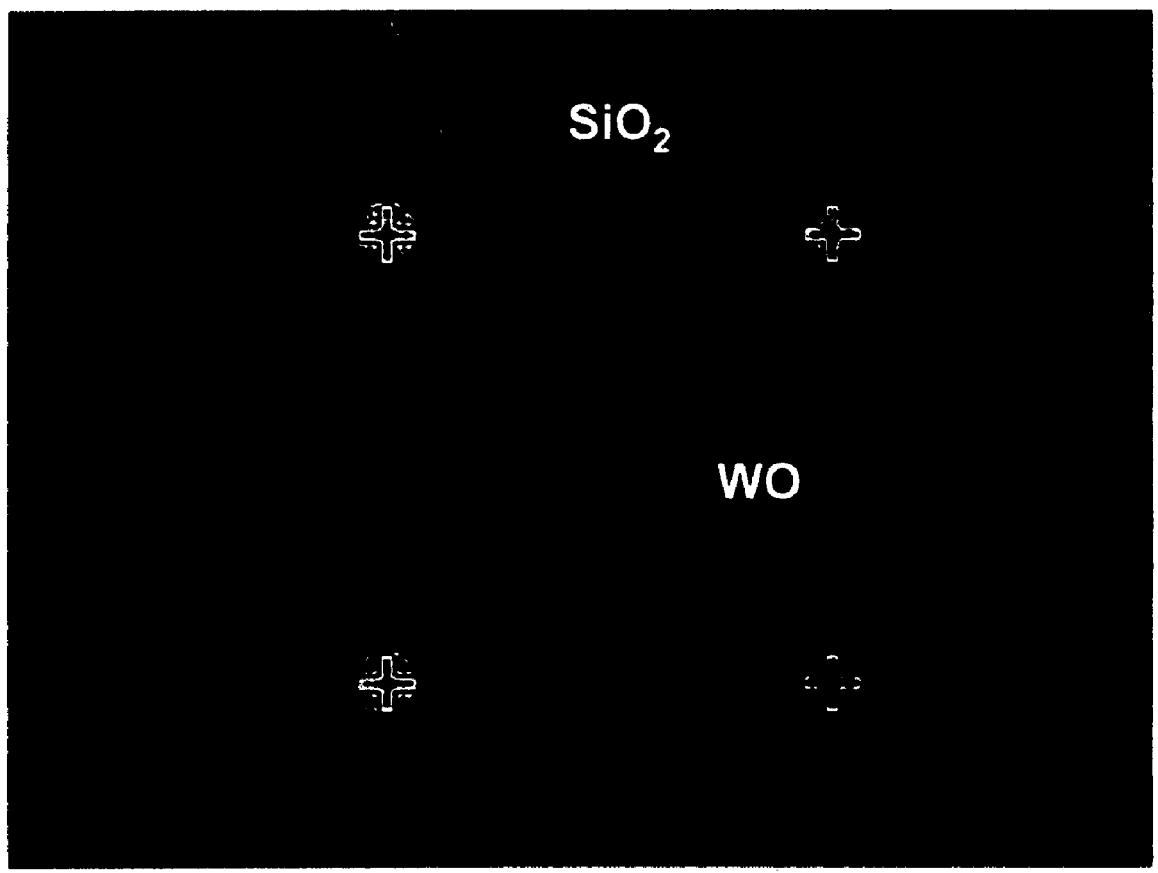
FIG. 3 is a photograph showing an insulation layer, which is formed on a substrate by the insulation layer patterning method according to the embodiment of the present invention.
Figure 4A:
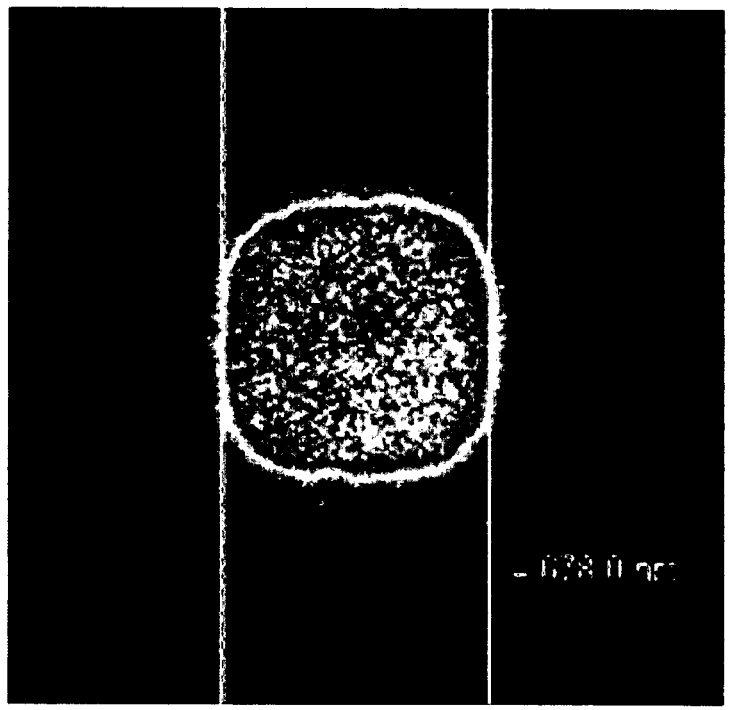
FIGS. 4A through 4C are photographs showing insulation layers each having a nano-sized hole, which is formed by the method according to the embodiment of the present invention.
Figure 4B:
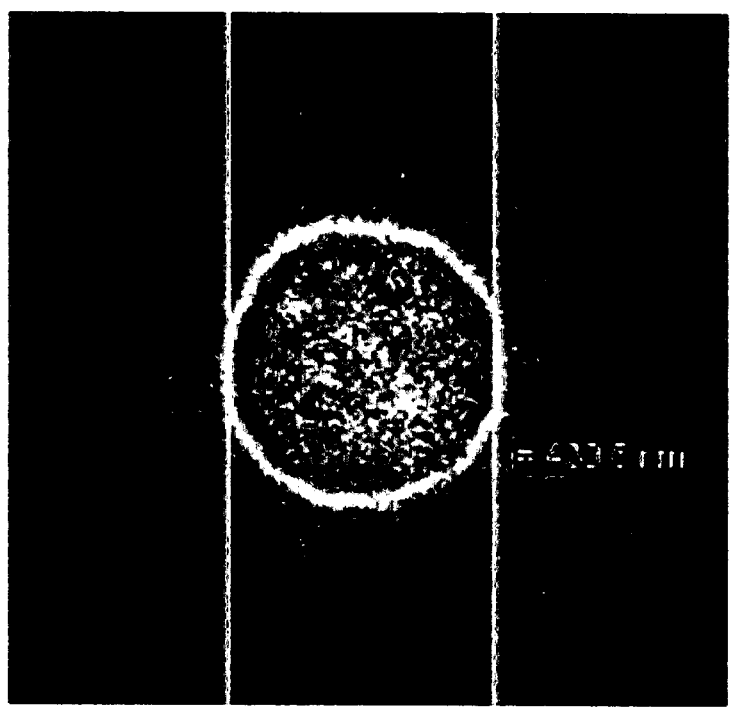
Figure 4C:
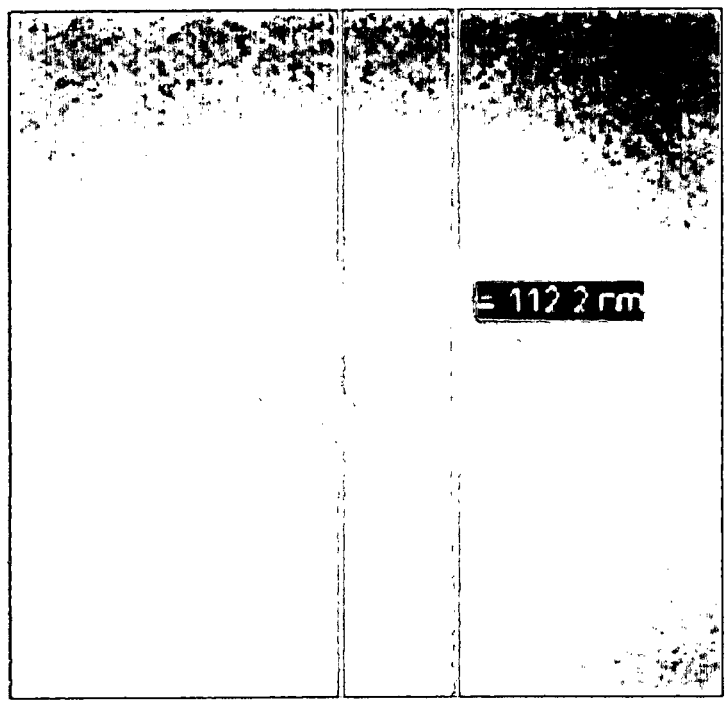

FIG. 3 is a photograph showing an insulation layer formed by the above-described insulation layer patterning method according to an embodiment of the present invention. FIGS. 4A through 4C are photographs showing insulation layers each having a nano-hole. That is, since the insulation layer patterning method of the present invention can form a fine pattern up to 100 nm, the miniaturization and integration of the semiconductor device become possible.

The insulation layer formed by an embodiment of the present invention includes SiO$_2$. The insulation layer formed according to the present invention may include a material having a dielectric constant less than 4.

Figure 6:
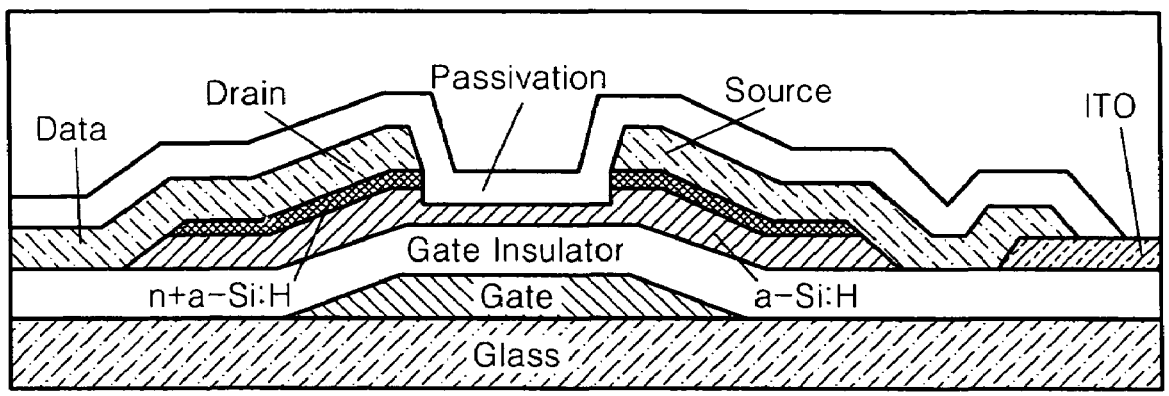
FIG. 6 is a schematic view of an exemplary display device structure, the indium tin oxide (ITO) layer of which may be formed according to the present invention.

According to another aspect of the present invention, the present invention provides a display device employing the insulation layer formed by the above-described patterning method. The display device may be one of a vacuum fluorescent display (VFD), a cathode ray tube (CRT), a field emission display (FED), and a plasma display panel (PDP). Methods for manufacturing a display device employing a patterned insulation layer are known in the art. For example, FIG. 6 is a schematic view of an exemplary display device structure, the indium tin oxide (ITO) layer of which may be formed according to the present invention. which is incorporated herein by reference. The insulation layer of the present invention also may be applied to a semiconductor manufacturing process. For example, a semiconductor device has an insulation layer between a TR and a metal electric wire or between metal electric wires.

The present invention will become more apparent by the following exemplary embodiment. The invention may, however, be embodied in many different forms and should not be construed as being limited to the embodiments set forth herein.

EMBODIMENT

Insulation Layer Patterning

A conventional HSSQ (hydrogen silsesquioxane or HSQ) material formed of H-Si—OCH$_3$ monomer was prepared. The HSSQ material and MIBK were mixed in the weight ratio of 1:3. The resulting HSSQ solution was coated on a Si substrate through a spin-coating process and baked at a temperature of 110° C. for 2 minutes, thereby forming a HSSQ insulation layer having a thickness of 140 nm on the Si substrate. Light having an intensity of 150 mJ/cm$^2$ was emitted to the HSSQ layer, where a patterned mask is applied, to form exposed and non-exposed regions. The HSSQ insulation layer was dipped in isopropyl alcohol for 10 minutes to form a pattern. The pattern was baked at a temperature of 130° C. to form the insulation layer pattern.

According to the present invention, the insulation layer has a good profile of a pattern boundary surface and the substrate is not damaged. In addition, a precise desired pattern can be obtained. Furthermore, the insulation layer can be formed without going through an etching process, the overall process is simplified and the process cost and time can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for producing an insulation layer pattern which comprises:
    (a) forming a flowable oxide insulation layer on a surface of a substrate, said flowable oxide insulation layer being formed of a flowable oxide and a carrier solvent;
    (b) exposing a region of the flowable oxide insulation layer to an energy source thereby removing the carrier solvent from the exposed region of the flowable oxide insulation layer while an unexposed region of the flowable oxide insulation layer retains the carrier solvent; and (c) contacting the unexposed region of the flowable oxide insulation layer with a developer which is capable of dissolving the carrier solvent and the flowable oxide, thereby removing the carrier solvent and the flowable oxide from the exposed region to form an insulation layer pattern on the substrate.

2. The method according to claim 1, wherein a weight ratio of the flowable oxide and the carrier solvent ranges from about 1:1 to about 1:0.

3. The method according to claim 1, wherein the flowable oxide is a composition comprising an insulation substance selected from the group consisting of $SiO_2$, SiON, and a mixture thereof and a solvent.

4. The method according to claim 1, wherein the flowable oxide is formed by dissolving H—Si—$OCH_3$ or H—$Si(OR)_3$ (R=$CH_3$ or $C_2H_5$) monomer in a solvent.

5. The method according to claim 1, wherein the solvent in which the monomer is dissolved is $H_2O$ or deionized water.

6. The method of claim 4, wherein the carrier solvent is soluble in both the solvent for dissolving the monomer and the developer.

7. The method according to claim 1, wherein the carrier solvent is selected from the group consisting of methyl isobutyl ketone (MIBK), tetra-methyl ammonium hydroxide (TMAH) and a mixture thereof.

8. The method according to claim 1, wherein the developer is an alcohol.

9. The method according to claim 8, wherein the alcohol is methanol, ethanol, or isopropyl alcohol.

10. The method according to claim 1, wherein a thickness of the flowable oxide insulation layer is about 50 nm - about 2000 nm.

11. The method according to claim 1, wherein the energy source of step (b) is light.

12. The method according to claim 1, wherein the exposure of step (b) is performed by applying light having an intensity of about 100 $mJ/cm^2$—about 2000 $mJ/cm^2$.

13. The method according to claim 1, wherein the step (c) comprises dipping the insulation layer on the substrate in isopropyl alcohol for about 5 minutes - about 10 minutes.

14. The method according to claim 1, wherein the step (a) comprises curing a flowable oxide layer coated on the surface of the substrate.

15. The method according to claim 14, wherein the curing is performed by baking the flowable oxide layer at a temperature of about 100° C.- about 130° C.

16. The method according to claim 1, wherein the flowable oxide insulation pattern of step (c) is further subjected to a baking.

17. The method according to claim 16, wherein the baking is performed at a temperature of about 120° C.- about 300° C.

18. A patterned insulating layer, which is produced by the method of claim 1.

19. The insulating layer of claim 18, wherein the insulating layer is formed of a material selected from the group consisting of $SiO_2$, SiON, and a mixture thereof.

20. The insulating layer of claim 18, wherein a dielectric constant of the insulating layer is less than 4.

21. A display device having the insulating layer of claim 18.

* * * * *